United States Patent
Nagashima

(10) Patent No.: US 8,333,910 B2
(45) Date of Patent: Dec. 18, 2012

(54) MICROENCAPSULATED SILANE COUPLING AGENT

(75) Inventor: Minoru Nagashima, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 379 days.

(21) Appl. No.: 12/734,970

(22) PCT Filed: Nov. 11, 2008

(86) PCT No.: PCT/JP2008/070469
§ 371 (c)(1),
(2), (4) Date: Jun. 7, 2010

(87) PCT Pub. No.: WO2009/104312
PCT Pub. Date: Aug. 27, 2009

(65) Prior Publication Data
US 2010/0243962 A1    Sep. 30, 2010

(30) Foreign Application Priority Data

Feb. 20, 2008  (JP) .................................. 2008-038629

(51) Int. Cl.
*H01B 1/00*    (2006.01)
*B32B 5/16*    (2006.01)
*C08G 73/06*   (2006.01)

(52) U.S. Cl. ................... 252/500; 428/407; 528/423

(58) Field of Classification Search ....... 252/500–521.6; 428/407; 528/423
See application file for complete search history.

(56) References Cited

U.S. PATENT DOCUMENTS

| | | | | |
|---|---|---|---|---|
| 5,357,008 A * | 10/1994 | Tsai et al. | | 525/526 |
| 8,128,837 B2 * | 3/2012 | Masuko et al. | | 252/182.13 |
| 8,211,330 B2 * | 7/2012 | Masuko et al. | | 252/182.13 |
| 2008/0249258 A1 * | 10/2008 | Masuko et al. | | 525/452 |
| 2012/0007259 A1 * | 1/2012 | Ying et al. | | 257/778 |

FOREIGN PATENT DOCUMENTS

| | | |
|---|---|---|
| CN | 101115782 A | 1/2008 |
| JP | A 9-012683 | 1/1997 |
| JP | A 10-237079 | 9/1998 |
| JP | A 11-092482 | 4/1999 |
| JP | A 2005-002000 | 1/2005 |
| JP | A 2005-112822 | 4/2005 |
| JP | A 2007-204669 | 8/2007 |
| JP | A-2007-211056 | 8/2007 |
| JP | A 2008-255219 | 10/2008 |
| JP | A 2008-255246 | 10/2008 |
| WO | WO 2004/037885 A1 | 5/2004 |

OTHER PUBLICATIONS

Office Action issued in Chinese Patent Application No. 200880127549.X dated Mar. 12, 2012 (with translation).
International Search Report issued in corresponding International Application No. PCT/JP2008/070469, mailed Feb. 10, 2009. (with English-language translation).
International Preliminary Report on Patentability issued in corresponding International Application No. PCT/JP2008/070469, issued Oct. 5, 2010.
Taiwanese Office Action issued in Taiwanese Patent Application No. 97144792 dated Oct. 11, 2011 (with translation).

\* cited by examiner

*Primary Examiner* — Mark Kopec
*Assistant Examiner* — Jaison Thomas
(74) *Attorney, Agent, or Firm* — Oliff & Berridge, PLC

(57) ABSTRACT

A microencapsulated silane coupling agent includes adduct particles of an epoxy compound and an imidazole silane coupling agent, and an ethyl cellulose film coating a periphery of the adduct particles, in which the ethyl cellulose film is crosslinked by a polyfunctional isocyanate compound. Preferred examples of the imidazole silane coupling agent include a compound represented by the formula (1),

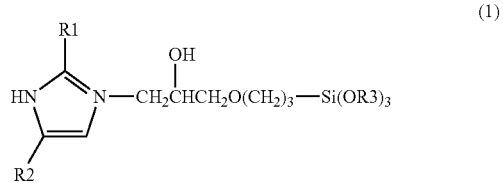

(1)

wherein R1 and R2 are each independently a hydrogen atom or a lower alkyl group, and R3 is a lower alkyl group.

6 Claims, No Drawings

MICROENCAPSULATED SILANE COUPLING AGENT

TECHNICAL FIELD

The present invention relates to a microencapsulated silane coupling agent which can improve the adhesion of a cured product of an epoxy resin composition on an inorganic surface and on an organic surface of a cured product of an epoxy resin composition, without harming the storage stability of the epoxy resin compositions.

BACKGROUND ART

When connecting a connection terminal of a semiconductor chip with a circuit pattern on a connection substrate, a paste-like or film-shape anisotropic conductive adhesive is often used. In this case, there is a need to improve the adhesive force of the anisotropic conductive adhesive with a passivation film on the surface on the connecting side of the semiconductor chip, and to improve the adhesion between the anisotropic conductive adhesive and the semiconductor chip, between the anisotropic conductive adhesive and an organic substrate, and between a wiring metal surface of a wiring circuit and the anisotropic conductive adhesive.

To achieve this, an ordinary silane coupling agent, which has an organic reactive group, such as vinyltrimethoxysilane and epoxytrimethoxysilane, and a trialkoxy group, and has a relatively low boiling point, is added to the anisotropic conductive adhesive. However, when a semiconductor chip is mounted on a wiring substrate via an anisotropic conductive adhesive containing such an ordinary silane coupling agent, the adhesion with the passivation film cannot be said to be sufficient. As a result, problems arise such as peeling occurring on the adhesion interface due to a heat shock from a solder reflow treatment or the like, and voids being produced in the cured adhesive due to vaporization of the silane coupling agent.

Therefore, it has been proposed to use a silane coupling agent which has an imidazole residue in the molecule instead of the conventional ordinary silane coupling agent (Patent Document 1).

[Patent Document 1] Japanese Patent Application Laid-Open No. Hei 9-12683

DISCLOSURE OF THE INVENTION

Problems the Invention is to Solve

However, there is the problem that when the imidazole silane coupling agent of Patent Document 1 is added to an epoxy resin composition, it is difficult to ensure the storage stability of the epoxy resin composition due to the presence in the silane coupling agent of the imidazole residue which reacts with a glycidyl group, even if a latent curing agent is used as the curing agent for an epoxy resin.

It is an object of the present invention to resolve the above-described problems in the conventional art, by providing a microencapsulated silane coupling agent which, when added to an epoxy resin composition, enables a cured product of the epoxy resin composition to exhibit a good adhesive force against the passivation film of a semiconductor chip, suppresses the occurrence of peeling at the adhesion interface and the occurrence of voids in the cured product, and also realizes good storage stability in the epoxy resin composition.

Means for Solving the Problems

To achieve the above-described object, the present inventors focused on microencapsulation of an imidazole silane coupling agent. Based on extensive studies as to how the microencapsulation should be carried out, the present inventors discovered that, when preparing adduct particles of an epoxy compound and an imidazole silane coupling agent, if ethyl cellulose is made to coexist and if a specific saturated hydrocarbon solvent, in which the epoxy compound and the imidazole silane coupling agent do not dissolve or are not miscible at ordinary temperatures, but in which the epoxy compound and the imidazole silane coupling agent uniformly dissolve by heating, is used as the solvent, surprisingly the ethyl cellulose not only contributes to an improvement in the dispersion stability of the adduct particles formed from the epoxy resin and the imidazole silane coupling agent, but also functions as a shell for the adduct particles and reacts with a polyfunctional isocyanate compound. This allows an imidazole silane coupling agent which achieves the above-described object to be obtained, thereby completing the present invention.

Specifically, the present invention provides a microencapsulated silane coupling agent comprising adduct particles of an epoxy compound and an imidazole silane coupling agent, and an ethyl cellulose film coating a periphery of the adduct particles, in which the ethyl cellulose film is crosslinked by a polyfunctional isocyanate compound.

Furthermore, the present invention provides a method for producing the above-described microencapsulated silane coupling agent, the method characterized by heating and dissolving an epoxy compound, an imidazole silane coupling agent, and ethyl cellulose to 110 to 130° C. while stirring in a saturated hydrocarbon solvent having an aniline point of 75 to 85° C. and a distillation initial boiling point of 150 to 230° C., then causing an adduct reaction to occur between the epoxy compound and the imidazole silane coupling agent to obtain a slurry of the adduct, cooling the slurry to a temperature of 80 to 100° C., and adding to the slurry a polyfunctional isocyanate compound to crosslink the ethyl cellulose film.

In addition, the present invention provides a thermosetting epoxy resin composition which includes a thermosetting epoxy resin, the above-described microencapsulated silane coupling agent, and a latent curing agent for the epoxy resin. Furthermore, the present invention also provides an anisotropic conductive adhesive which includes this thermosetting epoxy resin composition and conductive particles which are dispersed therein.

Effects of the Invention

In the microencapsulated silane coupling agent of the present invention, the adduct particles of an epoxy compound and an imidazole silane coupling agent are coated with an ethyl cellulose film, and the surface of the ethyl cellulose film is crosslinked by a polyfunctional isocyanate compound. Therefore, good solvent resistance can be exhibited and the storage stability of the blended epoxy resin composition can be improved while also maintaining the good characteristics of an imidazole silane coupling agent. Furthermore, according to the production method of the present invention, the ethyl cellulose contributes to dispersion stability when the epoxy compound and the imidazole silane coupling agent form the adduct particles, functions as a shell for the adduct particles, and also serves as a reaction site with the polyfunctional isocyanate compound. Accordingly, a microencapsulated silane coupling agent in the form of particles, which has as a main component an imidazole silane coupling agent that exhibits excellent solvent resistance, can be produced in a single batch. This method also has the ancillary advantage of obviating the need to use an amphiphilic polymer compound, which requires a laborious trial and error selection process.

BEST MODE FOR CARRYING OUT THE INVENTION

The microencapsulated silane coupling agent of the present invention, which has an imidazole silane coupling agent as a main component, comprises adduct particles of an epoxy compound and an imidazole silane coupling agent, and an ethyl cellulose film coating a periphery of the adduct particles, in which the ethyl cellulose film is crosslinked by a polyfunctional isocyanate compound.

Preferred examples of the epoxy compound forming the adduct particles include compounds or resins having two or more epoxy groups in their molecules. These may be liquid or solid. Specific examples include known epoxy resins such as: glycidyl ethers obtained by reacting epichlorohydrin with a polyhydric phenol such as bisphenol A, bisphenol F, bisphenol S, hexahydrobisphenol A, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl) methane, bixylenol, phenol-novolac, or cresol-novolac; polyglycidyl ethers obtained by reacting epichlorohydrin with an aliphatic polyhydric alcohol such as glycerin, neopentyl glycol, ethylene glycol, propylene glycol, butylene glycol, hexylene glycol, polyethylene glycol, or polypropylene glycol; glycidyl ether esters obtained by reacting epichlorohydrin with a hydroxycarboxylic acid such as p-oxybenzoic acid or β-oxynaphthoic acid, or polyglycidyl esters obtained from polycarboxylic acids such as phthalic acid, methylphthalic acid, isophthalic acid, terephthalic acid, tetrahydrophthalic acid, hexahydrophthalic acid, endomethylene tetrahydrophthalic acid, endomethylene hexahydrophthalic acid, trimellitic acid, and polymerized fatty acids; glycidylaminoglycidyl ethers obtained from aminophenols and aminoalkylphenols; glycidylaminoglycidyl esters obtained from aminobenzoic acids; glycidylamines obtained from aniline, toluidine, tribromoaniline, xylylenediamine, diamino cyclohexane, bisaminomethylcyclohexane, 4,4'-diaminodiphenyl methane, and 4,4'-diaminodiphenyl sulfone; and epoxydized polyolefins.

The imidazole silane coupling agent forming the adduct particles is a silane compound having an imidazolyl group and a dialkoxy group or a trialkoxy group in the molecule. Preferably, the imidazole silane coupling agent is a compound represented by the following formula (1).

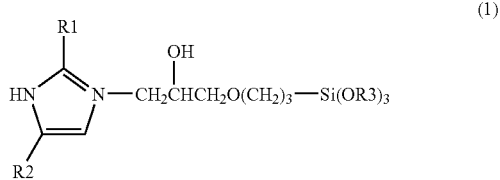

(1)

In the formula (1), R1 and R2 are each independently a hydrogen atom or a lower alkyl group such as methyl, ethyl, propyl, or butyl, and R3 is a lower alkyl group such as methyl, ethyl, propyl, or butyl. Preferred specific examples of the compound represented by the formula (1) include a compound where R1 and R2 are hydrogen atoms, and R3 is a methyl group.

Regarding the ratio of the epoxy compound and the imidazole silane coupling agent which are used when forming the adduct particles, when the used amount of the epoxy compound is too large, the reactivity of the adduct tends to be too low. In contrast, when the used amount of the imidazole silane coupling agent is too large, the reactivity of the adduct tends to be excessively high. Therefore, the amount of the imidazole silane coupling agent is preferably 150 to 5 parts by mass, more preferably 100 to 10 parts by mass, and particularly preferably 70 to 25 parts by mass, with respect to 100 parts by mass of the epoxy compound.

The ethyl cellulose forming the ethyl cellulose film which coats the adduct particles has a degree of substitution of the three hydroxyl groups present in the β-glucose repeating units which constitute the cellulose skeleton of preferably 2.25 to 2.60, more preferably 2.30 to 2.55, and particularly preferably 2.40 to 2.52, as the average per repeating unit. Stated another way, this value of 2.40 to 2.52 is equivalent to the ratio of ethoxy groups to the total amount of hydroxyl groups and ethoxy groups in the ethyl cellulose constituting the ethyl cellulose film prior to crosslinking by the polyfunctional isocyanate compound having a value of 80 to 84 mol %. If the degree of substitution of the hydroxyl groups is outside the above range, the solubility of the ethyl cellulose in the reaction system is affected. Specific examples of such an ethyl cellulose include N300, N200, N100, N50 and the like available from Hercules Incorporated.

When the used amount of ethyl cellulose is too small, the particle size of the adduct tends to increase, so that the dispersion stability is reduced. When the used amount is too large, the ethyl cellulose tends not to form the shell and to remain as a residue. Therefore, the used amount of ethyl cellulose is preferably 1 to 50 parts by mass, more preferably 2.5 to 25 parts by mass, and particularly preferably 5 to 10 parts by mass, with respect to 100 parts by mass of the total of the epoxy compound and imidazole silane coupling agent forming the adduct particles. The presence of the ethyl cellulose film can be confirmed by the presence of a characteristic peak of ethyl cellulose due to thermal decomposition in gas chromatography analysis of a sample.

In the microencapsulated silane coupling agent of the present invention, the ethyl cellulose film is crosslinked by a polyfunctional isocyanate compound. Any polyfunctional isocyanate compound conventionally used during microencapsulation of an epoxy latent curing agent can be used as the polyfunctional isocyanate compound. Examples thereof include toluene diisocyanate, methylene diphenyl diisocyanate, hydrogenated methylene diphenyl diisocyanate, 1,5-naphthalene diisocyanate, isophorone diisocyanate, hexamethylene diisocyanate, xylylene diisocyanate, hydrogenated xylylene diisocyanate, tetramethylxylene diisocyanate, 1,3,6-hexamethylene triisocyanate, lysine diisocyanate, triphenylmethane triisocyanate, tris(isocyanatephenyl)thiophosphate and the like. These may be used alone or in combination of two or more thereof.

When the used amount of the polyfunctional isocyanate compound is too small, the solvent resistance of the microencapsulated silane coupling agent tends to be insufficient. When the used amount of the polyfunctional isocyanate compound is too large, the microcapsule skin tends to become harder. Therefore, the amount of the polyfunctional isocyanate compound is preferably 0.5 to 50 parts by mass, more preferably 1 to 20 parts by mass, and particularly preferably 2 to 12 parts by mass, with respect to 100 parts by mass of the adduct particles.

The shape of the thus-obtained microencapsulated silane coupling agent is preferably spherical. From the standpoints of curability and dispersibility, the particle size of the microencapsulated silane coupling agent is preferably 1 to 10 μm, and more preferably 2 to 7 μm.

The microencapsulated silane coupling agent of the present invention can be produced in a single batch as follows.

First, the epoxy compound, imidazole silane coupling agent, and ethyl cellulose are dissolved by heating to 110 to 130° C. while stirring in a saturated hydrocarbon solvent with solubility parameters of an aniline point of 75 to 85° C. and a distillation initial boiling point of 150 to 230° C. Then, an adduct reaction is caused to occur between the epoxy compound and the imidazole silane coupling agent to obtain a slurry of the adduct.

As the saturated hydrocarbon solvent, a saturated hydrocarbon solvent is used in which the epoxy compound, imidazole silane coupling agent, and ethyl cellulose do not dissolve at room temperature, but begin to dissolve above 50° C., and are completely dissolved by 100° C., and in which the below-described polyfunctional isocyanate compound dissolves at least by 80 to 100° C. By using such a solvent, the adduct particles can be coated with ethyl cellulose, and the ethyl cellulose can also be crosslinked by the polyfunctional isocyanate compound. Specific examples of such a saturated hydrocarbon solvent which can be used include No. 1 kerosene stipulated in JIS (Japanese Industrial Standards), saturated hydrocarbon cleaning solvent (Shellsol MC-311, Shell Chemicals Japan Ltd.; No. 0 Solvent-L, Nippon Oil Corporation; Mineral Spirits A, Nippon Oil Corporation) and the like.

The used amount of the saturated hydrocarbon solvent may be determined by taking into consideration the solvent power with respect to the epoxy compound, imidazole silane coupling agent, and ethyl cellulose, and the concentration and viscosity of the slurry to be formed. Typically, the amount is 300 to 2,000 parts by mass based on a total of 100 parts by mass of the above components.

The stirring during the formation of the adduct particles may be performed using a propeller stirrer, a homogenizer or the like. From the standpoint of controlling the particle size, this stirring is preferably performed under conditions of 1,000 to 20,000 rpm.

The reaction temperature during the formation of the adduct particles is 110 to 130° C. This is because an excessively low reaction temperature tends to result in insufficient reaction and because an excessively high reaction temperature tends to result in the decomposition of the formed adduct.

The adduct reaction is terminated when the reaction solution turns brown. The reaction is typically completed after heating for 20 minutes to 2 hours, whereby the slurry of the adduct particles is obtained.

Next, the slurry of the adduct particles is stirred without heating and is cooled to 80 to 100° C., a temperature at which the adduct reaction of the epoxy compound and the imidazole silane coupling agent essentially does not occur.

While maintaining this temperature, the polyfunctional isocyanate compound is added to the slurry to cause a crosslinking reaction among the hydroxyl groups in the ethyl cellulose film. Typically, the crosslinking reaction is completed in 20 minutes to 2 hours. After completion of the reaction, the slurry is cooled to room temperature. The solid is then separated by filtration, washed with an organic medium such as hexane, and dried, whereby a powder of a latent curing agent for an epoxy resin having excellent solvent resistance and a particle size of 1 to 10 μm can be obtained.

The microencapsulated silane coupling agent of the present invention can provide a low-temperature, fast-curing thermosetting epoxy resin composition by mixing and stirring the microencapsulated silane coupling agent, together with the latent curing agent for an epoxy resin and other optionally-added additives (such as a pigment, filler and the like), with a known thermosetting epoxy resin. Typically, the microencapsulated silane coupling agent is added to the thermosetting epoxy resin in a ratio of preferably 1 to 20 parts by mass, and more preferably 3 to 10 parts by mass, with respect to 100 parts by mass of the thermosetting epoxy resin. On the other hand, the latent curing agent for an epoxy resin is added in a ratio of preferably 10 to 100 parts by mass, and more preferably 25 to 70 parts by mass. Examples of the latent curing agent for an epoxy resin include imidazole latent curing agents (Novacure Series, Asahi Kasei Chemicals Corporation; and Amicure, Ajinomoto Fine-Techno Co., Inc.) and polyamine latent curing agents (Fujicure, Fuji Kasei Kogyo CO., Ltd.).

Since a microencapsulated silane coupling agent with excellent solvent resistance and adhesive force is used, this thermosetting epoxy resin composition has excellent storage stability even though it is a one-component type. Moreover, in this thermosetting epoxy resin composition, interfacial peeling does not easily occur and the occurrence of voids is also suppressed.

Moreover, the thermosetting epoxy resin composition can be used as an anisotropic conductive adhesive by further adding thereto known conductive particles, such as nickel particles, for anisotropic conductive connection and a known film-forming resin such as phenoxy resin. When formed into a film shape, the thermosetting epoxy resin composition can be used as an anisotropic conductive film. The type, particle size, and added amount of the conductive particles and the type, added amount, film thickness and the like of the film-forming component may be the same as those of known anisotropic conductive pastes and anisotropic conductive films. An example of the composition of a representative anisotropic conductive paste or film is 8 to 12 parts by mass of the latent curing agent for an epoxy resin, 50 to 80 parts by mass of phenoxy resin, 20 to 50 parts by mass of the epoxy compound, 5 to 30 parts by mass of an epoxy-modified polyolefin, 1 to 20 parts by mass of the microencapsulated silane coupling agent, and 1 to 20 parts by mass of conductive particles. Moreover, other solvents, monomers for dilution, and the like may optionally be appropriately added. Such an anisotropic conductive paste or anisotropic conductive film allows low-temperature, rapid connection at 150° C. in about 5 seconds and provides a low conduction resistance and a good bonding strength.

EXAMPLES

The present invention will now be described in more detail using the following examples.

Example 1

Preparation of Microencapsulated Silane Coupling Agent

A three-necked flask equipped with a thermocouple, a stirring apparatus, and a cooling apparatus was charged with 23 parts by mass of a liquid epoxy resin (EP828, Japan Epoxy Resins Co., Ltd.), 7 parts by mass of an imidazole silane coupling agent (IS1000, Japan Energy Corporation; corresponding to the compound of formula (I) in which R1 and R2 are H), 30 parts by mass of a 10% ethyl cellulose solution (N100, Hercules Incorporated; 80 to 105 degree of hydroxyl group substitution), and 70 parts by mass of mineral spirits (Nippon Oil Corporation). The resultant mixture was heated while stirring at 1,800 rpm. When the solvent was refluxed, and the temperature of the mixture reached approximately 120° C., the flask was cooled in a water bath. When the temperature of the mixture reached approximately 80° C., 0.3 g of a polyfunctional isocyanate compound (Coronate L45, Nippon Polyurethane Industry Co., Ltd.) was charged into the flask, and the resultant mixture was cooled to room temperature while stirring to obtain a microencapsulated silane coupling agent mixture in slurry form. The obtained slurry mixture was filtrated to obtain a solid. This solid was washed with hexane, and then dried under reduced pressure for 12 hours at 50° C. in a vacuum oven to obtain a spherical microencapsulated silane coupling agent with an average particle size of 4.6 µm.

Example 2

Preparation of Thermosetting Epoxy Resin Composition

A thermosetting epoxy resin composition was prepared by mixing 5 parts by mass of the microencapsulated silane coupling agent obtained in Example 1, 20 parts by mass of a phenoxy resin (YP-50, Tohto Kasei Co., Ltd.), 50 parts by mass of a liquid epoxy resin (EP828, Japan Epoxy Resins Co., Ltd.), 80 parts by mass of spherical fused silica (DF-5V, Tatsumori Ltd.) and 30 parts by mass of a latent curing agent for an epoxy resin (Novacure HX-3941HP, Asahi Kasei Corporation).

Example 3

Preparation of Thermosetting Epoxy Resin Composition

A thermosetting epoxy resin composition was prepared in the same manner as in Example 2, except that the used amount of the microencapsulated silane coupling agent obtained in Example 1 was changed from 5 parts by mass to 10 parts by mass.

Comparative Example 1

Preparation of Thermosetting Epoxy Resin Composition

A thermosetting epoxy resin composition was prepared in the same manner as in Example 2, except that instead of the microencapsulated silane coupling agent obtained in Example 1, the imidazole silane coupling agent (IS1000, Japan Energy Corporation) was used without microencapsulating.

Comparative Example 2

Preparation of Thermosetting Epoxy Resin Composition

A thermosetting epoxy resin composition was prepared in the same manner as in Example 2, except that instead of the microencapsulated silane coupling agent obtained in Example 1, 2-(3,4-epoxycyclohexyl)ethyltrimethoxysilane (A-187, Nippon Unicar Company Limited) was used.

Evaluations and Tests

The thermosetting epoxy resin compositions obtained in Examples 2 and 3 and in Comparative Examples 1 and 2 were subjected to the following tests and evaluations. The obtained results are shown in Table 1.

<Storage Stability Test>

The thermosetting epoxy resin compositions were applied in a thickness of 25 µm on a release sheet. The sheets were then placed in a 55° C. thermostatic bath, and removed after 24 hours. The sheets were dipped in methyl ethyl ketone at room temperature, and visually observed. Cases where the film shape had disappeared were determined as having good storage stability, while cases where the film shape was maintained were determined as being defective (cured).

<Bonding Strength Test>

Using the thermosetting epoxy resin compositions, a pressure-bonded sample was produced by pressing a test semiconductor chip on a predetermined pattern for conduction resistance evaluation. The adhesion properties after the pressing were determined by measuring die shear strength using a strength tester (BT-2400, Dage). In practice, a die shear strength of 40 kgf/3 mm$^2$ or more is desirable.

<Interfacial Peeling Test>

Pressure-bonded samples were prepared in the same manner as in the bonding strength test. The samples were then left in an 85° C., 85% RH environment, and subjected to reflow processing (maximum temperature 250° C.) three times. The presence of peeling on the connection interface of the semiconductor chip was then observed with an acoustic microscope (HYE-FOCUS, Hitachi Construction Machinery Co., Ltd.).

<Connection Reliability Test>

Pressure-bonded samples were prepared in the same manner as in the bonding strength test, and the initial insulation resistance was measured. A value of $10^{10} \Omega$ or more is desirable. Next, a pressure cooker test (PCT: 110° C., 85% RH, 500 hours) and a temperature cycle test (TCT: −55° C. ↔ 125° C.) were carried out on separate pressure-bonded samples. Furthermore, a discontinuous conduction resistance measurement was carried out for a predetermined number of times (1,000 times) to determine whether there were any openings. A state with a conduction resistance maximum of 1Ω or less (no openings) was determined as good.

TABLE 1

|  | Example 2 | Example 3 | Comparative Example 1 | Comparative Example 2 |
|---|---|---|---|---|
| Storage Stability | Good | Good | Defective (cured) | Good |
| Die Shear Strength (kgf/3 mm$^2$) | 51 or more (over range) | 48 | 51 or more (over range) | 22 |
| Interfacial Peeling | No | No | — | Yes |
| Connection Reliability |  |  |  |  |
| Insulation Resistance (Ω) | $10^{12}$ or more | $10^{12}$ or more | — | $10^{12}$ or more |
| PCT Resistance | Good | Good | — | Openings present |
| TCT Resistance | Good | Good | — | Openings present |

The microencapsulated silane coupling agent of Example 1 was obtained by coating adduct particles of an epoxy resin and an imidazole silane coupling agent with ethyl cellulose, and crosslinking with a polyfunctional isocyanate compound.

Therefore, the thermosetting epoxy resin compositions of Examples 2 and 3 which used the microencapsulated silane coupling agent of Example 1 showed good results for all of the test items. In contrast, the thermosetting epoxy resin composition of Comparative Example 1 used a non-microencapsulated imidazole silane coupling agent, and thus had a problem with storage stability. Furthermore, the thermosetting epoxy resin composition of Comparative Example 2 used a conventional type of silane coupling agent, which was not microencapsulated, and thus while there were no problems with storage stability, die shear strength was low, and there was also a problem with adhesive strength. As a result, peeling problems and problems with PCT resistance and the TCT characteristics also occurred.

INDUSTRIAL APPLICABILITY

In the microencapsulated silane coupling agent of the present invention, the adduct particles of an epoxy compound and an imidazole silane coupling agent are coated with an ethyl cellulose film, and the surface of the ethyl cellulose film is crosslinked by a polyfunctional isocyanate compound. Therefore, when the microencapsulated silane coupling agent of the present invention is added to an epoxy resin composition, good adhesion can be realized between a cured product of the epoxy resin composition and a passivation film of a semiconductor chip, the occurrence of peeling at the adhesion interface and the occurrence of voids in the cured product can be suppressed, yet good storage stability can be realized for the epoxy resin composition.

The invention claimed is:

1. A microencapsulated silane coupling agent comprising adduct particles of an epoxy compound and an imidazole silane coupling agent, and an ethyl cellulose film coating a periphery of the adduct particles, in which the ethyl cellulose film is crosslinked by a polyfunctional isocyanate compound.

2. The microencapsulated silane coupling agent according to claim 1, wherein the imidazole silane coupling agent is a compound represented by the following formula (1):

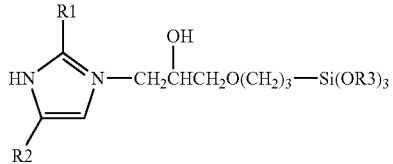

wherein R1 and R2 are each independently a hydrogen atom or a lower alkyl group, and R3 is a lower alkyl group.

3. The microencapsulated silane coupling agent according to claim 1, wherein a ratio of ethoxy groups to a total amount of hydroxyl groups and ethoxy groups in the ethyl cellulose constituting the ethyl cellulose film prior to crosslinking by the polyfunctional isocyanate compound is 80 to 84 mol %.

4. A method for producing the microencapsulated silane coupling agent according to claim 1, wherein
heating and dissolving the epoxy compound, the imidazole silane coupling agent, and ethyl cellulose to 110 to 130° C. while stirring in a saturated hydrocarbon solvent having an aniline point of 75 to 85° C. and a distillation initial boiling point of 150 to 230° C., then causing an adduct reaction to occur between the epoxy compound and the imidazole silane coupling agent to obtain a slurry of the adduct, cooling the slurry to a temperature of 80 to 100° C., and adding to the slurry a polyfunctional isocyanate compound to crosslink the ethyl cellulose film.

5. A thermosetting epoxy resin composition comprising a thermosetting epoxy resin, the microencapsulated silane coupling agent according to claim 1, and a latent curing agent for the epoxy resin.

6. An anisotropic conductive adhesive comprising the thermosetting epoxy resin composition according to claim 5 and conductive particles which are dispersed therein.

* * * * *